(12) United States Patent
Zhao

(10) Patent No.: US 9,705,342 B2
(45) Date of Patent: Jul. 11, 2017

(54) BATTERY EQUALIZING CIRCUIT

(75) Inventor: Jianhua Zhao, Shanghai (CN)

(73) Assignee: DONGGUAN CELLWISE MICROELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 13/697,524

(22) PCT Filed: Mar. 21, 2012

(86) PCT No.: PCT/CN2012/072673
§ 371 (c)(1),
(2), (4) Date: Nov. 12, 2012

(87) PCT Pub. No.: WO2013/117027
PCT Pub. Date: Aug. 15, 2013

(65) Prior Publication Data
US 2014/0340049 A1   Nov. 20, 2014

(30) Foreign Application Priority Data
Feb. 8, 2012   (CN) .......................... 2012 1 0027136

(51) Int. Cl.
*H02J 7/00* (2006.01)
*G05F 1/10* (2006.01)
(Continued)

(52) U.S. Cl.
CPC ............ *H02J 7/0014* (2013.01); *H02J 7/007* (2013.01); *H02J 7/0016* (2013.01);
(Continued)

(58) Field of Classification Search
CPC ........ G01R 31/3658; H02J 7/00; H02J 7/007; H02J 7/0014
(Continued)

(56) References Cited

U.S. PATENT DOCUMENTS 4,238,721 A * 12/1980 DeLuca ................ H02J 7/0016
                                                   320/122
5,850,136 A * 12/1998 Kaneko ................ H02J 7/0016
                                                   320/119
(Continued)

FOREIGN PATENT DOCUMENTS

| CN | 101345431 A | 1/2009 |
| CN | 101471577 A | 7/2009 |

(Continued)

OTHER PUBLICATIONS

Zetex semiconductors, ZXLD 1350 1 Watt LED driver with internal switch, 2005, Target spec. Issue 1—Dec. 2005.*
(Continued)

*Primary Examiner* — Samuel Berhanu
*Assistant Examiner* — Tarikh Rankine
(74) *Attorney, Agent, or Firm* — Cheng-Ju Chiang

(57) ABSTRACT

The present disclosure discloses a battery equalizing circuit, which comprises a first battery unit, a second battery unit, a current detecting resistor, an equalizing inductor, a first control switch, a second control switch and a feedback control circuit. The first battery unit is connected in series with the second battery unit. The first battery unit, the current detecting resistor, the equalizing inductor and the first control switch are electrically connected with each other to form a first circuit loop. The second battery unit, the current detecting resistor, the equalizing inductor and the second control switch are electrically connected with each other to form a second circuit loop. The feedback control circuit is connected in parallel with the current detecting resistor to detect a voltage drop across the current detecting resistor, and switch between the first and the second circuit loop so as to make an equalizing current substantially constant.

5 Claims, 4 Drawing Sheets

(51) Int. Cl.
  *B60L 11/18* (2006.01)
  *H01M 10/42* (2006.01)
  *G01R 31/36* (2006.01)

(52) U.S. Cl.
  CPC .......... *H02J 7/0019* (2013.01); *H02J 7/0078* (2013.01); *B60L 11/1866* (2013.01); *G01R 31/3658* (2013.01); *H01M 2010/4271* (2013.01); *H02J 7/0052* (2013.01); *H02J 2007/0059* (2013.01)

(58) Field of Classification Search
  USPC ........ 320/116, 118, 120, 121, 124, 145, 146
  See application file for complete search history.

(56) References Cited

U.S. PATENT DOCUMENTS

| | | | | |
|---|---|---|---|---|
| 6,150,795 | A * | 11/2000 | Kutkut et al. | 320/118 |
| 7,855,515 | B2 * | 12/2010 | Huang et al. | 315/185 R |
| 2009/0295339 | A1 * | 12/2009 | Wong | 320/162 |
| 2010/0109608 | A1 * | 5/2010 | Buono et al. | 320/121 |
| 2011/0316344 | A1 * | 12/2011 | Van Lammeren | 307/77 |
| 2012/0038321 | A1 * | 2/2012 | Cheng et al. | 320/116 |

FOREIGN PATENT DOCUMENTS

| | | |
|---|---|---|
| CN | 101501956 A | 8/2009 |
| CN | 101741122 A | 6/2010 |
| CN | 101867210 A | 10/2010 |
| JP | H09252543 A | 9/1997 |
| WO | 2009014407 A2 | 1/2009 |

OTHER PUBLICATIONS

International Search Report, International Application No. PCT/CN2012/072673, Nov. 22, 2012.

* cited by examiner

BATTERY EQUALIZING CIRCUIT

FIELD OF THE INVENTION

The present disclosure generally relates to the technical field of battery management, and more particularly, to a battery equalizing circuit for use in a battery management system.

BACKGROUND OF THE INVENTION

Currently, a battery pack generally comprises a number of battery units connected in series. Because of differences among the individual battery units in terms of the charging status, the impedance, the temperature characteristics or the like, an imbalance among the individual battery units may arise. Such an imbalance will lead to a reduced capacity and a shortened service life of the overall battery pack. Therefore, it is necessary to use a battery equalizing circuit in the battery pack to compensate for the imbalance so as to maintain the capacity and prolong the service life of the battery pack.

FIG. 1 is a schematic view of a prior art battery equalizing circuit. As shown in FIG. 1, the prior art battery equalizing circuit 100 is an active equalizing circuit designed on the basis of an inductor, and comprises a battery unit 110, a battery unit 120, an inductor 130, a control switch 140 and a control switch 150. The battery unit 110, the inductor 130 and the control switch 140 form a first circuit loop, and the battery unit 120, the inductor 130 and the control switch 150 form a second circuit loop. The control switch 140 and the control switch 150 are controlled to be turned on and off alternately by a pair of complementary pulse-width modulation (PWM) signals. By adjusting duty ratios of the PWM signals, a magnitude of the equalizing current can be adjusted so that, through the inductor 130, energy from the battery unit 110 is transferred to the battery pack 120 or vice versa.

The prior art battery equalizing circuit 100 features a simple structure and can supply a large equalizing current. However, the equalizing current is liable to influences from many factors such as temperature changes, changes in voltage levels of the battery units, differences among individual devices, the line resistances and so on. Therefore, the equalizing current may vary greatly even if the duty ratios of the PWM signals remain unchanged, which makes the equalizing effect of the whole circuit unsatisfactory. Furthermore, the equalizing current in the prior art battery equalizing circuit 100 may exceed ratings of devices in some cases to cause risks. Accordingly, an urgent need exists in the art to develop a novel battery equalizing circuit that can solve the aforesaid problems.

SUMMARY OF THE INVENTION

An objective of the present disclosure is to overcome the shortcomings of the prior art battery equalizing circuit by providing a novel battery equalizing circuit that can keep the equalizing current relatively constant.

To achieve the aforesaid objective, the present disclosure provides a battery equalizing circuit, which comprises a first battery unit, a second battery unit, a current detecting resistor, an equalizing inductor, a first control switch, a second control switch and a feedback control circuit. The first battery unit is connected in series with the second battery unit. The first battery unit, the current detecting resistor, the equalizing inductor and the first control switch are electrically connected with each other to form a first circuit loop. The second battery unit, the current detecting resistor, the equalizing inductor and the second control switch are electrically connected with each other to form a second circuit loop. The feedback control circuit is a pulse width modulation (PWM) control circuit or a pulse frequency modulation (PFM) control circuit based on an error comparator. The feedback control circuit is connected in parallel with the current detecting resistor to detect a voltage drop across the current detecting resistor, and sends a control signal to the first control switch and the second control switch respectively to switch between the first circuit loop and the second circuit loop so as to make an equalizing current substantially constant.

In a preferred embodiment of the present disclosure, the first control switch and the second control switch are any two of an NMOS transistor, a PMOS transistor and a Schottky diode.

To achieve the aforesaid objective, the present disclosure further provides a battery equalizing circuit, which comprises a first battery unit, a second battery unit, a current detecting resistor, an equalizing inductor, a first control switch, a second control switch and a feedback control circuit. The first battery unit is connected in series with the second battery unit. The first battery unit, the current detecting resistor, the equalizing inductor and the first control switch are electrically connected with each other to form a first circuit loop. The second battery unit, the current detecting resistor, the equalizing inductor and the second control switch are electrically connected with each other to form a second circuit loop. The feedback control circuit is connected in parallel with the current detecting resistor to detect a voltage drop across the current detecting resistor, and comprises a reference voltage source and a hysteresis comparator. The reference voltage source is configured to supply a reference voltage and is electrically connected to a first terminal of the current detecting resistor and a negative input terminal of the hysteresis comparator. A positive input terminal of the hysteresis comparator is electrically connected to a second terminal of the current detecting resistor. An output terminal of the hysteresis comparator acts as an output terminal of the feedback control circuit to output the control signal to the first control switch and the second control switch respectively to switch between the first circuit loop and the second circuit loop so that an equalizing current is kept substantially constant.

In a preferred embodiment of the present disclosure, the first control switch and the second control switch are an NMOS transistor and a Schottky diode respectively.

In a preferred embodiment of the present disclosure, the first control switch and the second control switch are a PMOS transistor and a Schottky diode respectively.

In a preferred embodiment of the present disclosure, the first control switch and the second control switch are an NMOS transistor and a PMOS transistor respectively.

To achieve the aforesaid objective, the present disclosure further provides a battery equalizing circuit, which comprises a first battery unit, a second battery unit, a current detecting resistor, an equalizing inductor, a first control switch, a second control switch and a feedback control circuit. The first battery unit is connected in series with the second battery unit. The first battery unit, the current detecting resistor, the equalizing inductor and the first control switch are electrically connected with each other to form a first circuit loop. The second battery unit, the current detecting resistor, the equalizing inductor and the second control switch are electrically connected with each other to form a second circuit loop. The feedback control circuit is connected in parallel with the current detecting resistor to detect a voltage drop across the current detecting resistor, and sends a control signal to the first control switch and the second control switch respectively to switch between the first circuit loop and the second circuit loop so as to make an equalizing current substantially constant.

In a preferred embodiment of the present disclosure, the feedback control circuit comprises a reference voltage source and a hysteresis comparator, the reference voltage source is configured to supply a reference voltage and is electrically connected to a first terminal of the current detecting resistor and a negative input terminal of the hysteresis comparator, a positive input terminal of the hysteresis comparator is electrically connected to a second terminal of the current detecting resistor, and an output terminal of the hysteresis comparator acts as an output terminal of the feedback control circuit to output the control signal.

In a preferred embodiment of the present disclosure, the feedback control circuit is a PWM control circuit or a PFM control circuit based on an error comparator.

In a preferred embodiment of the present disclosure, the first control switch and the second control switch are an NMOS transistor and a Schottky diode respectively.

In a preferred embodiment of the present disclosure, the first control switch and the second control switch are a PMOS transistor and a Schottky diode respectively.

In a preferred embodiment of the present disclosure, the first control switch and the second control switch are an NMOS transistor and a PMOS transistor respectively.

In a preferred embodiment of the present disclosure, the first battery unit and the second battery unit are electrically connected to the equalizing inductor via the current detecting resistor respectively.

In a preferred embodiment of the present disclosure, the equalizing inductor is electrically connected to the first control switch and the second control switch via the current detecting resistor respectively.

According to the above descriptions, by using the feedback control circuit to acquire the voltage drop across the current detecting resistor, the battery equalizing circuit of the present disclosure can automatically adjust the duty ratio of the control signal to keep the equalizing current substantially constant. In this way, an optimum equalizing effect is achieved for the whole battery equalizing circuit, and the risk that the equalizing current would exceed ratings of devices can be avoided. Thereby, the shortcomings of the prior art battery equalizing circuit is overcome.

What described above is only a brief summary of the technical solutions of the present disclosure. In order to provide a better understanding of the technical means of the present disclosure so that the present disclosure can be practiced according to this specification and in order to make the aforesaid and other objectives, features and advantages of the present disclosure more apparent, preferred embodiments of the present disclosure will be detailed hereinafter with reference to the attached drawings.

DETAILED DESCRIPTION OF THE INVENTION

In order to further describe the technical solutions adopted to achieve the objectives of the present disclosure and the efficacies thereof, implementations, methods, steps, structures, features and efficacies of the battery equalizing circuit according to the present disclosure will be detailed hereinbelow with reference to the attached drawings and preferred embodiments thereof. The aforesaid and other technical disclosures, features and efficacies of the present disclosure will become apparent from the following detailed description of the preferred embodiments that is made with reference to the attached drawings. The technical solutions and the efficacies thereof will be better understood by those of ordinary skill in the art upon reviewing the following description. However, the attached drawings are only provided for illustration purpose but not to limit the present disclosure.

Figure 1:
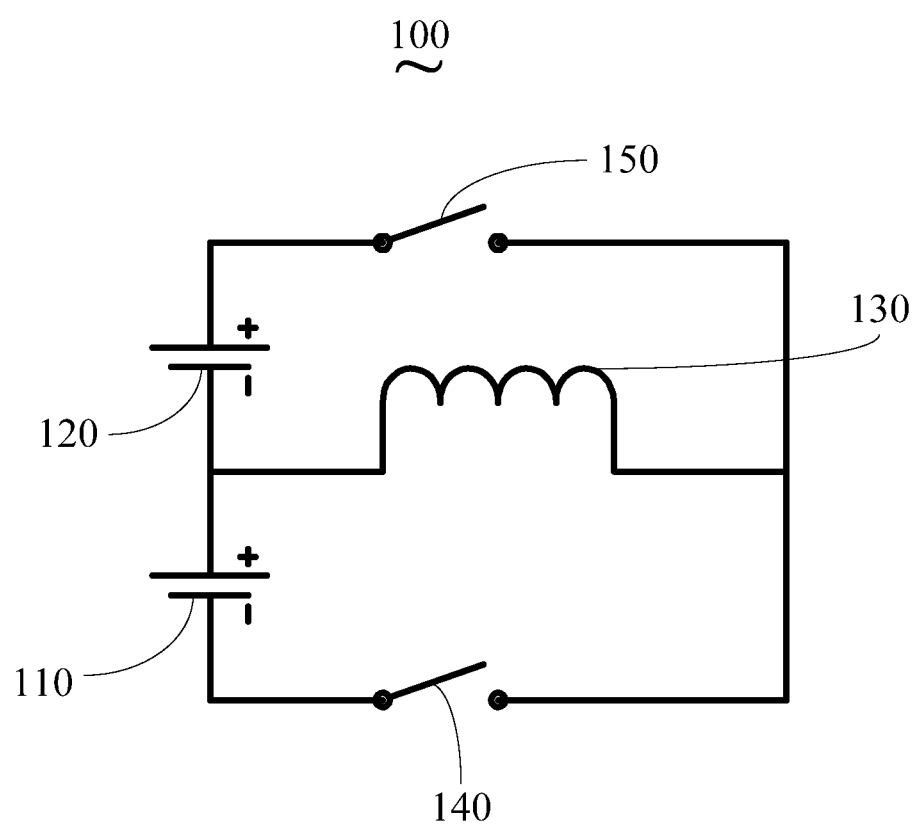
FIG. 1 is a schematic view of a prior art battery equalizing circuit.
Figure 2:
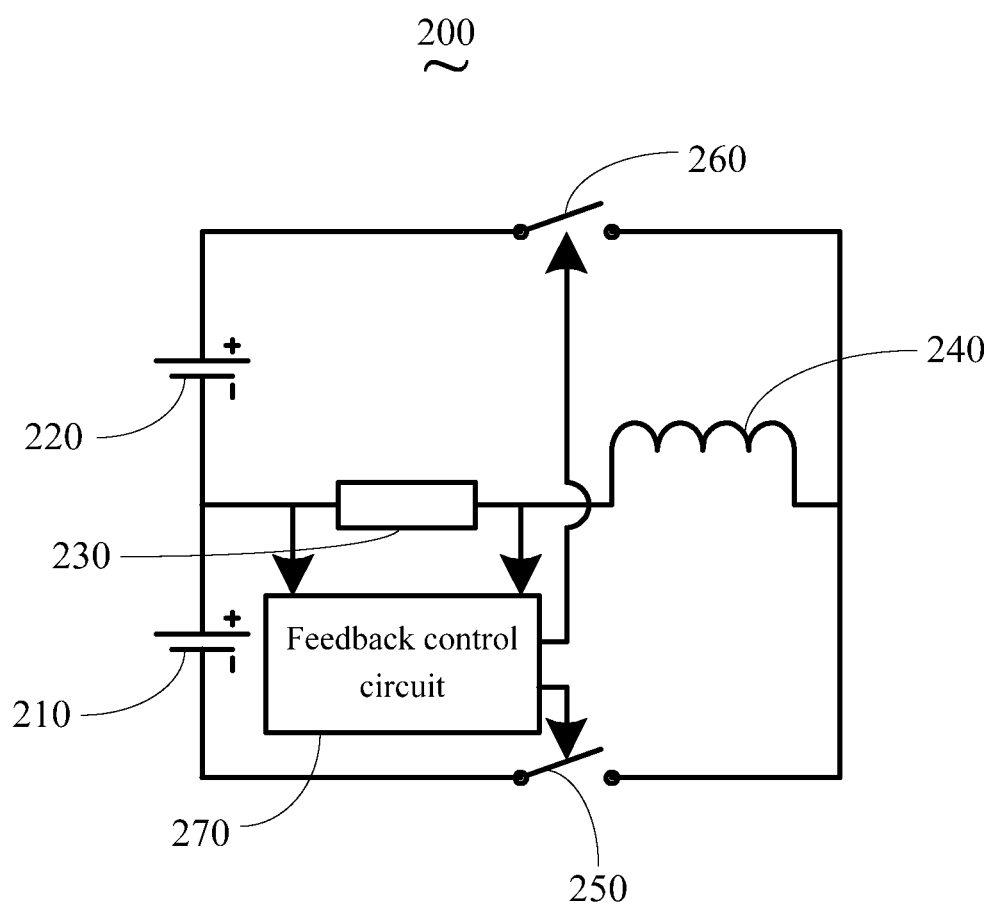
FIG. 2 is a schematic view of a battery equalizing circuit according to a preferred embodiment of the present disclosure.

FIG. 2 is a schematic view of a battery equalizing circuit according to a preferred embodiment of the present disclosure. As shown in FIG. 2, the battery equalizing circuit 200 of the present disclosure is also an active equalizing circuit designed on the basis of an inductor, and comprises a first battery unit 210, a second battery unit 220, a current detecting resistor 230, an equalizing inductor 240, a first control switch 250, a second control switch 260 and a feedback control circuit 270.

The first battery unit 210 is connected in series with the second battery unit 220. The first battery unit 210, the current detecting resistor 230, the equalizing inductor 240 and the first control switch 250 form a first circuit loop, and the second battery unit 220, the current detecting resistor 230, the equalizing inductor 240 and the second control switch 260 form a second circuit loop. The feedback control circuit 270 is connected in parallel with the current detecting resistor 230 to detect a voltage drop across the current detecting resistor 230, and sends a control signal to the first control switch 250 and the second control switch 260 respectively to switch between the first circuit loop and the second circuit loop. In this way, the voltage drop across the current detecting resistor 230 is controlled to be about a fixed value so as to make an equalizing current substantially constant.

Figure 3:
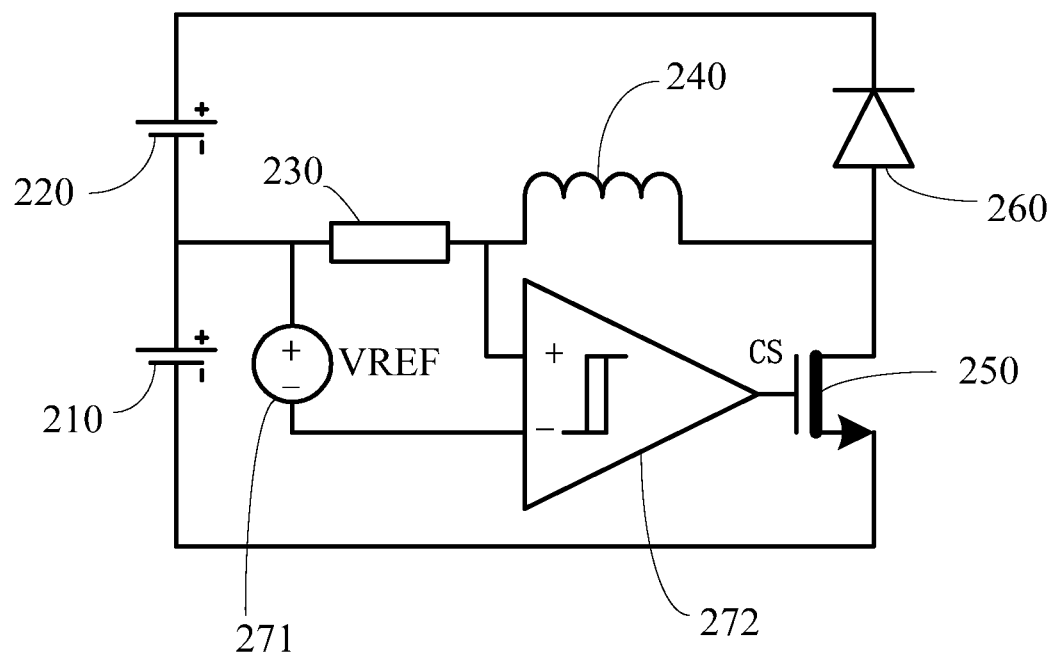
FIG. 3 is a schematic view illustrating details of the battery equalizing circuit shown in FIG. 2.

FIG. 3 is a schematic view illustrating details of the battery equalizing circuit shown in FIG. 2. As shown in FIG. 3, the feedback control circuit 270 comprises a reference voltage source 271 and a hysteresis comparator 272. The reference voltage source 271 is configured to supply a reference voltage VREF and is electrically connected to a first terminal of the current detecting resistor 230 and a negative input terminal of the hysteresis comparator 272. A positive input terminal of the hysteresis comparator 272 is electrically connected to a second terminal of the current detecting resistor 230. An output terminal of the hysteresis comparator 272 acts as an output terminal of the feedback control circuit 270 to output a control signal CS.

Furthermore, in this embodiment, the first control switch 250 and the second control switch 260 may implemented by an NMOS transistor and a Schottky diode respectively, and are controlled by the control signal CS outputted by the output terminal of the hysteresis comparator 272 so that either the first circuit loop or the second circuit loop is turned on to switch between the first circuit loop and the second circuit loop.

Figure 4:
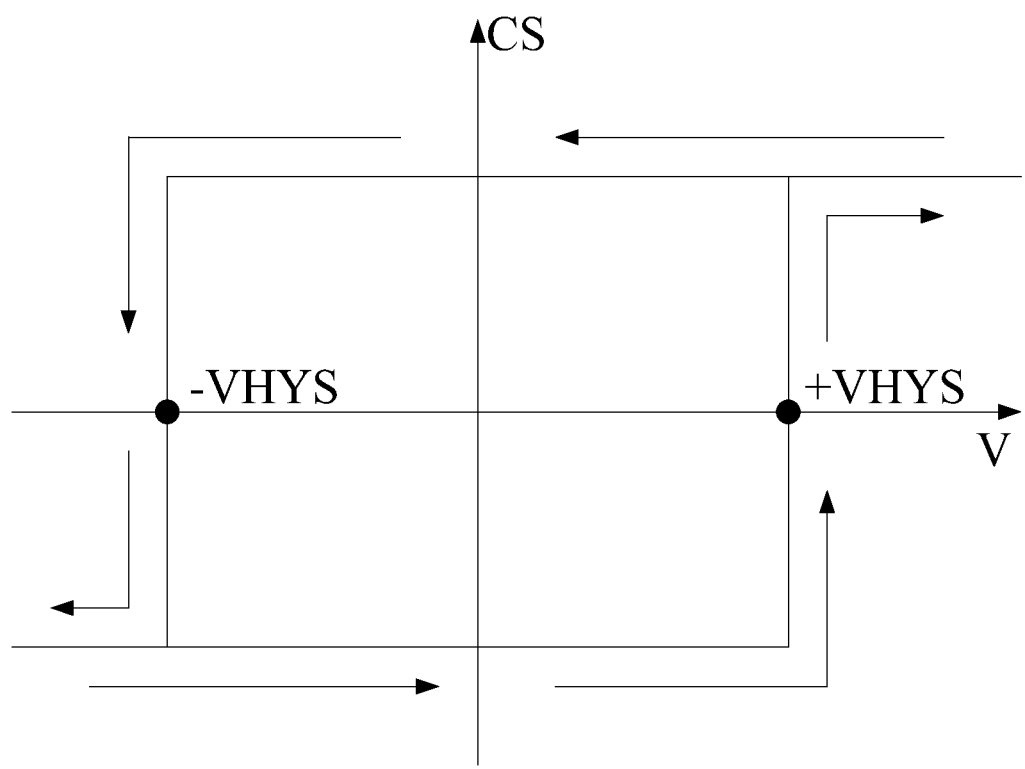
FIG. 4 is a schematic view illustrating the principle of a hysteresis comparator shown in FIG. 3.

FIG. 4 is a schematic view illustrating the principle of the hysteresis comparator shown in FIG. 3. Hereinbelow, the operating principle of the battery equalizing circuit of the present disclosure will be described specifically. Referring to FIG. 2 to FIG. 4 together, when the voltage at the second terminal of the current detecting resistor 230 rises to a positive threshold voltage +VHYS of the hysteresis comparator 272 (i.e., when the voltage at the positive input terminal of the hysteresis comparator 272 rises to the positive threshold voltage +VHYS of the hysteresis comparator 272), the voltage drop across the current detecting resistor 230 is −VREF+VHYS, and the control signal CS outputted by the output terminal of the hysteresis comparator 272 is switched to have a positive polarity. Therefore, the NMOS transistor 250 acting as a control switch is turned on, so the first circuit loop formed by the first battery unit 210, the current detecting resistor 230, the equalizing inductor 240 and the NMOS transistor 250 acting as a control switch is turned on.

Then, when the voltage at the second terminal of the current detecting resistor 230 drops to a negative threshold voltage −VHYS of the hysteresis comparator 272 (i.e., when the voltage at the positive input terminal of the hysteresis comparator 272 drops to the negative threshold voltage −VHYS of the hysteresis comparator 272), the voltage drop across the current detecting resistor 230 is −VREF−VHYS, and the control signal CS outputted by the output terminal of the hysteresis comparator 272 is switched to have a negative polarity. Therefore, the NMOS transistor 250 acting as a control switch is turned off; i.e., the first circuit loop is turned off. In this case, the Schottky diode 260 acting as a control switch is turned on, and the current in the equalizing inductor 240 can continue to flow through the Schottky diode 260. As a result, the second circuit loop formed by the second battery unit 220, the current detecting resistor 230, the equalizing inductor 240 and the Schottky diode 260 acting as a control switch is turned on.

The aforesaid process is repeated continuously (i.e., the first circuit loop and the second circuit loop are turned on alternately) so that electric energy is transferred between the first battery unit 210 and the second battery unit 220. Furthermore, the voltage drop across the current detecting resistor 230 is either −VREF+VHYS which turns on the first circuit loop or −VREF−VHYS which turns on the second circuit loop; and the reference voltage −VREF supplied by the reference voltage source 271 is much greater than the threshold voltage VHYS of the hysteresis comparator 272. Therefore, the feedback control circuit 270 can keep the voltage drop across the current detecting resistor 230 to be substantially about the fixed value VREF and keep the equalizing current flowing through the current detecting resistor 230 and the equalizing inductor 240 to be substantially VREF/R, with R representing a resistance value of the current detecting resistor 230.

Therefore, by using the feedback control circuit 270 to acquire the voltage drop across the current detecting resistor 230, the battery equalizing circuit 200 of the present disclosure can automatically adjust the duty ratio of the control signal CS to keep the equalizing current substantially constant. In this way, an optimum equalizing effect is achieved for the whole battery equalizing circuit 200, and the risk that the equalizing current would exceed ratings of devices can be avoided. Thereby, the shortcomings of the prior art battery equalizing circuit is overcome.

Although the feedback control circuit 270 is implemented by a hysteresis comparator in the aforesaid embodiment, it shall be appreciated by people skilled in the art that, the feedback control circuit 270 of the present disclosure may also be implemented by a pulse width modulation (PWM) control circuit or a pulse frequency modulation (PFM) control circuit based on an error amplifier. Additionally, the first control switch 250 and the second control switch 260 of the present disclosure may also be implemented by a PMOS transistor and a Schottky diode respectively, or by an NMOS transistor and a PMOS transistor respectively.

Furthermore, although the current detecting resistor 230 is disposed at the left side of the equalizing inductor 240 (i.e., the first battery unit 210 and the second battery unit 220 are electrically connected to the equalizing inductor 240 via the current detecting resistor 230) in the aforesaid embodiment, it shall be appreciated by people skilled in the art that, the current detecting resistor 230 of the present disclosure may also be disposed at the right side of the equalizing inductor 240 (i.e., the equalizing inductor 240 is electrically connected to the first control switch 250 and the second control switch 260 via the current detecting resistor 230 respectively).

According to the above descriptions, by using the feedback control circuit to acquire the voltage drop across the current detecting resistor, the battery equalizing circuit of the present disclosure can automatically adjust the duty ratio of the control signal to keep the equalizing current substantially constant. In this way, an optimum equalizing effect is achieved for the whole battery equalizing circuit, and the risk that the equalizing current would exceed ratings of devices can be avoided. Thereby, the shortcomings of the prior art battery equalizing circuit is overcome.

Although embodiments of the present disclosure have been disclosed above, they are not intended to limit the present disclosure. Various changes and modifications may be made by people skilled in the art without departing from the spirit and scope of the present disclosure, so the scope of the present disclosure shall be governed by the claims attached herein.

What is claimed is:

1. A battery equalizing circuit, comprising a first battery unit, a second battery unit, a current detecting resistor, an equalizing inductor, a first control switch, a second control switch and a feedback control circuit, wherein the first battery unit is connected in series with the second battery unit, the first battery unit, the current detecting resistor, the equalizing inductor and the first control switch are electrically connected with each other to form a first circuit loop, the second battery unit, the current detecting resistor, the equalizing inductor and the second control switch are electrically connected with each other to form a second circuit loop, the feedback control circuit is connected in parallel with the current detecting resistor to detect a voltage drop across the current detecting resistor, and comprises a reference voltage source and a hysteresis comparator, the reference voltage source is configured to supply a reference voltage and is electrically connected to a first terminal of the current detecting resistor and a negative input terminal of the hysteresis comparator, a positive input terminal of the hysteresis comparator is electrically connected to a second terminal of the current detecting resistor, and an output terminal of the hysteresis comparator acts as an output terminal of the feedback control circuit to output the control signal to the first control switch and the second control switch respectively to switch between the first circuit loop and the second circuit loop such that the first control switch and the second control switch are turned on alternately to make the first circuit loop and the second circuit loop turned on alternately;

wherein the positive input terminal of the hysteresis comparator is directly electrically-connected to a node between the current detecting resistor and the equalizing inductor, and the negative input terminal of the hysteresis comparator is directly electrically-connected to the reference voltage source.

2. The battery equalizing circuit of claim 1, wherein the first control switch and the second control switch are an NMOS transistor and a Schottky diode respectively.

3. The battery equalizing circuit of claim 1, wherein the first control switch and the second control switch are a PMOS transistor and a Schottky diode respectively.

4. The battery equalizing circuit of claim 1, wherein the first control switch and the second control switch are an NMOS transistor and a PMOS transistor respectively.

5. The battery equalizing circuit of claim 1, wherein the reference voltage source has a positive terminal and a negative terminal, the positive terminal of the reference voltage source is directly electrically-connected to the first terminal of the current detecting resistor directly, and the negative terminal of the reference voltage source is directly electrically-connected to the negative input terminal of the hysteresis comparator.

* * * * *